(12) United States Patent
Mizutani

(10) Patent No.: US 6,337,868 B1
(45) Date of Patent: Jan. 8, 2002

(54) DISTRIBUTED FEEDBACK SEMICONDUCTOR LASER AND A DRIVING METHOD THEREFOR

(75) Inventor: Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/203,516

(22) Filed: Dec. 1, 1998

(30) Foreign Application Priority Data

Dec. 3, 1997 (JP) ............................................. 9-348510
Nov. 13, 1998 (JP) ........................................... 10-341124

(51) Int. Cl.[7] .............................. H01S 3/10; H01S 3/08; H01S 5/00; H01S 3/00
(52) U.S. Cl. ............................. 372/27; 372/96; 372/50; 372/38.02
(58) Field of Search .............................. 372/26, 27, 29, 372/38.02, 32, 50, 96

(56) References Cited

U.S. PATENT DOCUMENTS 5,444,730 A   8/1995  Mizutani ...................... 372/45
5,659,560 A * 8/1997  Ouchi et al. .................. 372/27
5,946,336 A   8/1999  Mizutani et al. .............. 372/50

FOREIGN PATENT DOCUMENTS

JP        2-117190        5/1990
JP        7-162088        6/1995

* cited by examiner

*Primary Examiner*—Quyen Leung
(74) *Attorney, Agent, or Firm*—Fitzpatrick, Cella, Harper & Scinto

(57) ABSTRACT

A distributed feedback semiconductor laser includes a cavity extending in a cavity-axial direction and including a plurality of regions, and a plurality of waveguides with a diffraction grating and an active layer extending along the cavity-axial direction. The waveguides are formed in the regions, respectively, coupled to each other along the cavity-axial direction, and define different first and second polarization modes. The semiconductor laser further includes a light intensity distribution control portion formed in the cavity and having a function to relatively and locally strengthen light intensity distributions for the first and second polarization modes in the cavity-axial direction with a polarization dependency, and a control unit for independently stimulating at least two of the regions.

24 Claims, 7 Drawing Sheets

DISTRIBUTED FEEDBACK SEMICONDUCTOR LASER AND A DRIVING METHOD THEREFOR

BACKGROUND OF THE INVENTION

1. Field of the Invention

The present invention relates to a distributed feedback (DFB) semiconductor laser which can change its polarization mode of output light according to its stimulated condition and can be used as a signal light source for optical transmission and the like, and to a driving method of the DFB semiconductor laser.

2. Related Background Art

In a conventional oscillation polarization mode selective DFB semiconductor laser as disclosed in Japanese Patent Application Laid-Open No. 7(1995)-162088, for example, the relation between the wavelength dependency of gains created in its active layer and Bragg wavelengths determined by the pitch and the like of its diffraction grating is controlled, and a multi-electrode structure is adopted for that purpose.

As an oscillation polarization mode selective dynamic single mode semiconductor laser, the following device has been developed and proposed. The oscillation polarization mode selective device has a structure that can be modulated by a digital signal which is produced by superposing a minute-amplitude digital signal on a bias injection current. The device is a DFB semiconductor laser in which a distributed reflector of a grating is introduced into a semiconductor laser resonator or cavity and wavelength selectivity of the grating is utilized. In the device, strain is introduced into an active layer of a quantum well structure, or its Bragg wavelength is located at a position shorter than a peak wavelength of a gain spectrum, so that gains for transverse electric (TE) mode and transverse magnetic (TM) mode are approximately equal to each other for light at wavelengths close to an oscillation wavelength, under a current injection condition near an oscillation threshold. Further, a plurality of electrodes are arranged and currents are unevenly injected through those electrodes. An equivalent refractive index of the cavity is unevenly distributed by the uneven current injection, and oscillation occurs in one of the TE mode and the TM mode and at a wavelength which satisfies a phase matching condition and takes a minimum threshold gain. When the balance of the uneven current injection is slightly changed to vary a competitive relation of the phase condition between the TE mode and the TM mode, the oscillation polarization mode and wavelength of the device can be switched.

In that semiconductor device, an anti reflection coating is provided on one end facet to asymmetrically employ effects of the uneven current injection into its output-side portion and its modulation-electrode portion. Alternatively, lengths of the electrodes are made different from each other to introduce a structural asymmetry.

Further, Japanese Patent Application Laid-Open No. 2(1990)-117190 discloses a semiconductor laser apparatus which has two serially- or parallel-arranged semiconductor devices that primarily generate or amplify light waves in a predetermined polarization mode and another polarization mode, respectively.

However, the above conventional oscillation polarization mode selective DFB semiconductor laser, which selects the lapsing polarization mode depending on the phase condition, is sensitive to the phase at the end facet. As a result, the lapsing wavelength and polarization mode of the device depend on the current injection condition in a complicated fashion, and fluctuation in characteristics of the lapsing polarization mode appears among individual devices. In particular, regarding the fluctuation among devices, it is difficult to selectively impart a gain to one of the competing polarization modes when a current injected into one of two waveguide portions is increased, so that a lapsing polarization switching point varies among the devices.

Further, in the conventional laser, the phase relations of resonant light in the cavity for respective polarization modes are controlled by the balance of currents injected into a uniform structure extending in the cavity direction (a uniform active layer and a uniform diffraction grating), and the lapsing polarization mode is thus switched by changing the polarization mode whose oscillation threshold gain is the smallest. Therefore, the conventional laser suffer the following disadvantages.

(1) Since the light phase is controlled, the lapsing polarization mode is again returned to the TE mode, for example, when the switching from the TE mode to the TM mode is conducted by increasing a current injected into a certain region and thereafter this current is further increased.

(2) Due to the multi-electrode structure, a common polarization mode is not selected among plural regions when currents injected into those regions increase. The respective regions are thus brought into independent lapsing conditions, and those conditions influence each other to cause a plurality of longitudinal modes.

On the other hand, in the above another conventional DFB semiconductor laser, the light wave in the predetermined polarization mode is generated or amplified by the choice of its geometrical shape, so that its yield varies due to processing fluctuations of etching depth and edge width during its ridge fabrication process.

An object of the present invention is to provide a distributed feedback semiconductor laser which can simplify its stimulated condition (typically, its current injection condition) for causing the switching of its oscillation or lapsing polarization mode, a method for driving the semiconductor laser, a light source apparatus which can perform the modulation with a large extinction ratio using the semiconductor laser, an optical transmission method using the semiconductor laser, an opto-electric converting apparatus suitably usable in the optical transmission method, an optical transmission system using the opto-electric converting apparatus, and so forth.

SUMMARY OF THE INVENTION

A distributed feedback semiconductor laser of the present invention includes a cavity extending in a cavity-axial direction and including a plurality of regions, and a plurality of waveguides with a diffraction grating and an active layer extending along the cavity-axial direction. The waveguides are formed in the regions, respectively, coupled to each other along the cavity-axial direction, and define different first and second polarization modes (typically, TE mode and TM mode). The semiconductor laser further includes a light intensity distribution control portion formed in the cavity and having a function to relatively and locally strengthen light intensity distributions for the first and second polarization modes in the cavity-axial direction with a polarization dependency, and a control unit (typically, a current injection unit) for independently stimulating at least two of the regions.

The following specific structures are possible based on the above fundamental structure.

The light intensity distribution control portion imparts a larger action, which relatively strengthens a light intensity distribution at a place of the light intensity distribution control portion in the cavity, to one of the first and second polarization modes, as compared to the other of the first and second polarization modes. More specifically, the light intensity distribution control portion imparts substantially no action to the other of the first and second polarization modes.

The light intensity distribution control portion may comprise a phase shift section for shifting a phase of a periodical change in a refractive index for one of the first and second polarization modes due to the diffraction grating while not shifting a phase of a periodical change in a refractive index for the other of the first and second polarization modes due to the diffraction grating. Further, the phase shift section may shift the phase of the periodical change in the refractive index for one of the first and second polarization modes by 180 degrees. The phase shift portion shifts the phase for one polarization mode such that its light intensity is strengthened at a place of the shift section, while shifting the phase for the other polarization mode only to such a degree that its light intensity is strengthened less than the strengthening degree for one polarization mode. Preferably, the phase shift section imparts almost no phase shift to the other polarization mode.

In the above structure, the light intensity distribution control portion primarily sensed only by one polarization mode has a function to fixedly strengthen the light intensity for this mode at the place of this distribution control portion. In contrast, the other polarization mode comes to have a light intensity distribution different from that for the one polarization mode since the other mode cannot sense the function of the light intensity distribution control portion. In the specific structure, the phase shift section primarily sensed by one polarization mode has an action to cause oscillation at a center wavelength of the stopband in this mode and fixedly strengthen its light intensity at a place of the phase shift section. The other polarization mode has a light intensity distribution different from that for the one polarization mode since one mode cannot sense the phase shift action.

The light intensity distributions in the cavity-axial direction thus comes to be different between two competitive polarization modes. Therefore, independent current injections into the two regions are classified into one for inducing the oscillation in the TE mode and one for inducing the oscillation in the TM mode, for example. Hence, the switching of the lapsing polarization mode can be readily and stably performed by the control unit.

In one of typical configurations of the DFB semiconductor laser of the present invention, periodical striped grooves formed in a birefringence layer with a birefringence of $n_{ITE}$ (a refractive index for TE-mode light)>$n_{ITE}$ (a refractive index for TM-mode light) are buried with a layer with a refractive index of $n_b$ satisfying the relation $n_{ITE}>n_b>n_{ITM}$, and a portion, in which periodical striped grooves formed in a layer with a refractive index of $n_g$ satisfying the relation $n_g<n_b$ are buried with a layer with a refractive index of $n_b$, are serially arranged in the cavity-axial direction to form the phase shift section for shifting the phase only for the TE-mode light at an interface between the two portions in the diffraction grating. In this structure, the relation $(n_b-n_g) > (n_b-n_{ITM})$ is preferably satisfied.

The operation of the first typical configuration will be described with reference to FIGS. 1A to 1C. The phase of the diffraction grating sensed by the TE-mode light will be described first. In one portion (a portion on the right side of a phase shift section S in FIG. 1A, but this portion does not coincide with a region into which a current can be independently injected), the refractive index $n_{ITE}$ of a layer 107 with periodical stripes is larger than the refractive index $n_b$ of a burying layer 108, so that up portions of the periodical stripes correspond to up portions of a periodical change in the effective refractive index sensed by the TE-mode light. In the other portion (a portion on the left side of the section S in FIG. 1A), the refractive index $n_g$ of a layer 106 with periodical stripes is smaller than the refractive index $n_b$ of the burying layer 108, so that up portions of the periodical stripes correspond to down portions of a periodical change in the effective refractive index sensed by the TE-mode light. Therefore, the up and down change in the refractive index sensed by the TE-mode light is inverted at the phase shift section S relatively to the up and down change of the periodical stripes. This inversion serves as a phase shift in the diffraction grating.

The phase of the diffraction grating sensed by the TM-mode light will be described. In both the two portions, the refractive index $n_{ITM}$ of the layer with periodical stripes is smaller than the refractive index $n_b$ of the burying layer 108, so that no phase shift exists in the diffraction grating. Further, when the relation of $(n_b-n_g)>(n_b-n_{ITM})$ exists, a difference between up and down portions of the refractive index sensed by the TM-mode light in the portion on the left side of the section S is larger than that in the portion on the right side of the section S. Thus, the light intensity distributions as illustrated in FIG. C are established.

In the second typical configuration of the DFB semiconductor laser, a portion, in which periodical 5 striped grooves formed in a birefringence layer with a birefringence of $n_{ITE}$ (a refractive index for TE-mode light)>$n_{ITM}$ (a refractive index for TM-mode light) are buried with a layer with a refractive index of $n_b$ satisfying the relation $n_{ITE}>n_b>n_{ITM}$, and a portion, in which periodical striped grooves formed in a layer with a refractive index of $n_g$ satisfying the relation $n_g>n_b$ are buried with a layer with a refractive index of $n_b$, are serially arranged in the cavity-axial direction to form the phase shift section for shifting the phase only for the TM-mode light at an interface between the two portions in the diffraction grating. In this structure, the relation $(n_g-n_b) > (n_{ITE}-n_b)$ is preferably satisfied.

In the second typical configuration, the refractive index relation between the periodical stripes and the burying layer in the other portion is opposite to that of the first typical configuration, so the phase shift is present only for the TM-mode light.

In the typical configurations, more specifically, a pitch of the periodical stripes or the diffraction grating is uniform in the two portions. Further, the birefringence layer may be a multiple quantum well layer. In this case, the birefringence layer can be highly controllably formed using ordinary crystalline growth techniques. Furthermore, the phase shift section may be located around a central portion of one of the regions. Thereby, one of two electrodes serving as the control unit can correspond to a portion where a light intensity distribution for a predetermined polarization mode is large, so the mode switching can be readily carried out.

More specifically, the active layer may be an active layer with approximately equal gains for the TE-mode light and the TM-mode light common to the regions. In this structure, contribution of the polarization dependency in gains of the active layer to the mode switching characteristics can be suppressed, so that the mode switching can be readily effected by controlling currents injected into the regions.

Further, a high-reflection film may be provided on an end facet of an outermost region of the regions. In particular, the high-reflection film determines the light intensity distribution in the cavity for the mode light which cannot sense the action of the light intensity distribution control portion. The high-reflection film is preferably provided on the end facet of the outermost region without the light intensity distribution control portion. The high-reflection film fixedly brings a strong portion of the light intensity distribution for the polarization-mode light, which cannot sense the action of the light intensity distribution control portion, into the region lacking the distribution control portion. Thus, another light intensity distribution control portion is provided such that the light intensity distribuitons can have a more preferable polarization dependency.

In a driving method of the present invention, the above semiconductor laser is brought into an oscillation condition in the first polarization mode by injecting currents into at least two regions, and the current injected into one of the regions, whose electric-field or light intensity distribution for the second polarization mode is larger than its electric-field intensity distribution for the first polarization mode, is relatively increased to stably switch the oscillation condition in the first polarization mode to an oscillation condition in the second polarization mode. A uniform current can be injected into the regions by the control unit to bring the semiconductor laser into the oscillation condition in the first polarization mode. Further, the current injected into one of the regions, whose light intensity distribution for the first polarization mode is larger than its light intensity distribution for the second polarization mode, is relatively increased to stably switch the oscillation condition in the second polarization mode to the oscillation condition in the first polarization mode.

This driving method uses the property that when the current injected into the region whose field intensity distribution for a desired polarization mode is large is relatively increased, the lapsing polarization mode can be readily and stably switched to this desired polarization mode.

These advantages and others will be more readily understood from the following detailed description of the preferred embodiments in conjunction with the drawings.

DESCRIPTION OF THE PREFERRED EMBODIMENTS

[First Embodiment]

A first embodiment of the present invention, directed to a distributed feedback (DFB) semiconductor laser, will be described with reference to FIGS. 1A–1C and FIG. 3.

Figure 1A:
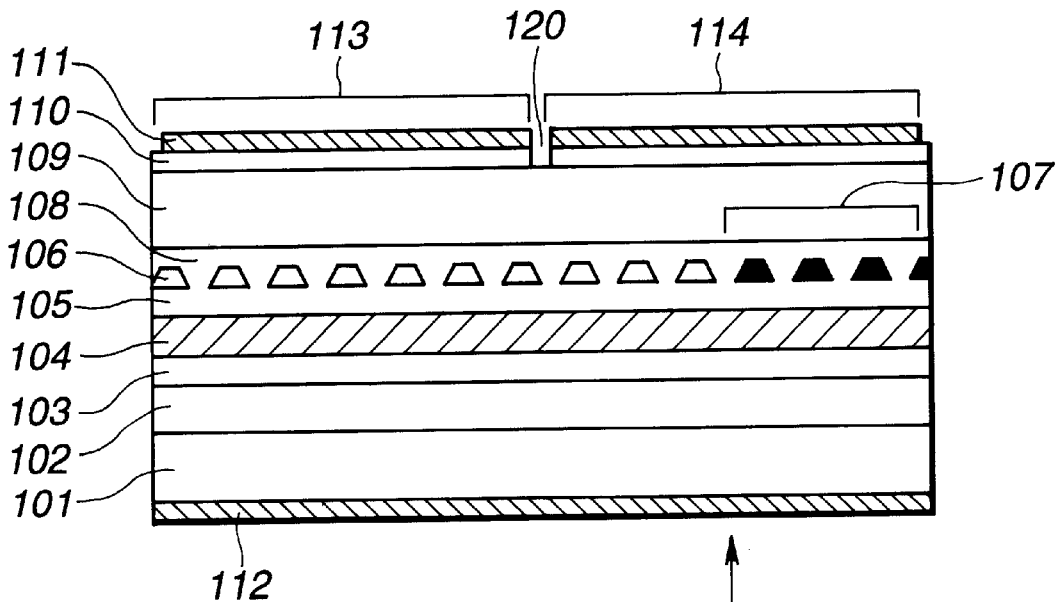
FIG. 1A is a cross-sectional view illustrating the cross section taken along a cavity-axial direction of a first embodiment of a DFB semiconductor laser according to the present invention.

The device has the following structure. In FIG. 1A, reference numeral 101 designates an n-type InP substrate. Reference numeral 102 designates an n-type InP buffer layer. Reference numeral 103 designates a lower light guide layer of InGaAsP with a thickness of 0.1 $\mu$m and a bandgap wavelength of 1.15 $\mu$m. Reference numeral 104 designates a triple strained quantum well active layer having InGaAs well layers with a thickness of 13 nm, into which a 0.6% tensile strain is introduced, and InGaAsP barrier layers with a thickness of 10 nm and a bandgap wavelength of 1.15 $\mu$m. Reference numeral 105 designates an upper light guide layer of InGaAsP with a thickness of 0.1 $\mu$m and a bandgap wavelength of 1.15 $\mu$m. Further, reference numeral 106 designates a p-InGaAsP grating-forming layer with a thickness of 0.1 $\mu$m and a bandgap wavelength of 1.0 $\mu$m, which is formed on the upper light guide layer 105. Reference numeral 107 designates a multiple quantum well grating-forming layer with a thickness of 0.1 $\mu$m, which is also formed on the upper light guide layer 105.

Periodical striped grooves (which extend perpendicularly to a sheet of FIG. 1A and are arranged along right and left directions of FIG. 1A) at a pitch of 240 nm acting as a diffraction grating are formed on the layers 106 and 107, and thereafter those grooves are buried with a p-InGaAsP light guide layer 108 having a bandgap wavelength of 1.15 $\mu$m. Thus, those periodical stripes are arranged in the light guide layers 105 and 108 of a common material in the cavity direction at a common pitch.

Further, reference numeral 109 designates a p-type InP clad layer. Reference numeral 110 designates a p-type InGaAs contact layer. Reference numeral 111 designates a p-electrode of a Cr/Au layer. Reference numeral 112 designates an n-electrode of an AuGe/Au layer formed on the substrate side. A separating portion 120 is formed by partly removing the p-electrode 111 and p-InGaAs layer 110, and the device is separated into the first and second regions 113 and 114 by the separating portion 120. Confinement of carriers and light in a lateral direction of the waveguide is achieved by a ridge-type waveguide, a buried-hetero-type waveguide, or the like.

In the 0.6% tensile-strained quantum well active layer 104 with the well thickness of 13 nm, its heavy hole energy level is approximately equal to its light hole energy level. Therefore, gains for TM-mode light and TE-mode light are close to each other, so that such an active layer structure as enables the polarization switching phenomenon is established.

In the compressively-strained multiple quantum well layer 107 by which a portion (a portion in the second region 114) of the grating-forming layer 106 is replaced, ten pairs of $In_{0.69}Ga_{0.31}As_{0.66}P_{0.34}$ well layers with 0.8% compressive strain and a thickness of 5 nm and non-strained $In_{0.9}Ga_{0.1}As_{0.21}P_{0.79}$ barrier layers with a thickness of 5 nm are deposited to construct a ten-well quantum well layer.

According to the thus-formed quantum well layer 107, its bandgap wavelength (Eg) for the TE mode is 1.25 μm and Eg for the TM mode is shorter than this value, namely 1.19 μm. Its refractive index sensed by the TE-mode light at a wavelength of 1.55 μm is 3.343, while that sensed by the TM-mode light is 3.318. On the other hand, the refractive index of the non-strained p-InGaAsP grating-forming layer 106 (Eg=1.0μm) is 3.226.

Since a refractive-index difference sensed by the TM-mode light between the strained quantum well layer 107 and the p-InGaAsP light guide layer 108 is small, the coupling coefficient sensed by the TM-mode light is small and the TM-mode light intensity in this portion during the operation tends to be preferably weakened.

The device of this embodiment is fabricated as follows. The first crystal growth is performed using MOVPE method to form the layers 102, 103, 104, 105 and 107 on the n-InP substrate 101. A selective growth mask of a $SiO_2$ layer is laid down over the multiple quantum well layer 107, and a portion of the $SiO_2$ layer (portions in the region 113 and in a part of the region 114) is removed by photolithography. The multiple quantum well layer 107 is partly removed by a selective etching using the $SiO_2$ layer as a mask. Furthermore, the grating-forming layer 106 is grown by a selective growth (the second crystal growth) using the $SiO_2$ layer as a mask. After the $SiO_2$ mask is removed, a stripe pattern of a 240 nm pitch for achieving the diffraction grating is formed by processing a resist layer deposited on the layers 106 and 107 using a two-light holographic exposure method. The stripe pattern is transferred to the layers 106 and 107 by etching. The resist is then removed, and a damaged layer on the layers 106 and 107 is removed by wet etching. The p-InGaAsP light guide layer 108 with Eg=1.15 μm is formed by the third crystal growth to bury the periodical striped grooves therewith and flaten the surface. The layers 109 and 110 are further grown. The upper electrode 111 is formed by a lift-off process using a resist pattern formed by a photolithography process. The contact layer 110 in the separating region 120 is removed to obtain the electric separation thereat. The wafer is then lapped, and the lower electrode 112 is formed on the bottom surface of the substrate 101. Alloying of the electrodes and cleaving of the wafer are performed to construct a DFB laser.

Figure 1B:
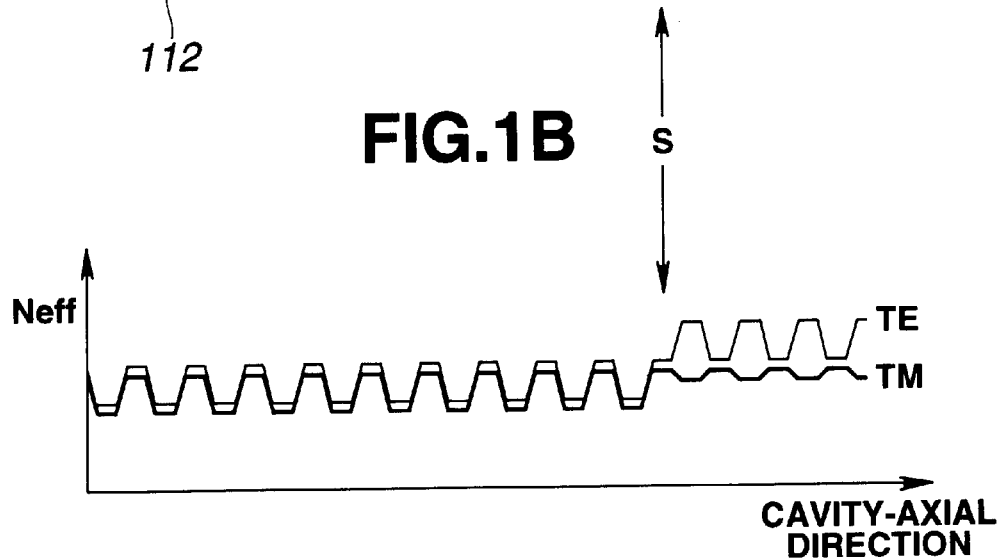
FIG. 1B is a view illustrating refractive-index distributions of diffraction gratings for two polarization modes along the cavity-axial direction in the first embodiment.

In FIG. 1B illustrating effective refractive-index distributions sensed by the TE-mode light and the TM-mode light along the cavity-axial direction, an up-and-down index change is inverted at a phase shift section S for the TE-mode light, while no inversion of the up-and-down index change occurs at the shift section S for the TM-mode light though a change in its magnitude exists (namely, a difference between the up and down portions in a left region of the phase shift section S is larger than that in its right region). Even in the left region of the section S including the layers 106 and 108 with no birefringence, there is a case where the birefringence of the effective refractive index may exist due to a difference between waveguide sizes in longitudinal and lateral directions. For example, as illustrated in FIG. 1B, the effective refractive index sensed by the TE-mode light is slightly larger than that sensed by the TM-mode light.

The periodical stripes of the layers 106 and 107 are surrounded by the InGaAsP layers 105 and 108 as illustrated in FIG. 1A to achieve the change of the effective indices as shown in FIG. 1B. If the layers 106 and 107 were directly formed on the active layer 104 and the striped grooves formed thereon were buried with the layer 108, materials under the diffraction grating would differ from each other between the portions on right and left sides of the section S. Hence, there may occur a fear that preferable effective index changes as illustrated in FIG. 1B would not be attained and preferable light intensity distributions for the TE mode and the TM mode in the cavity-axial direction as shown in FIG. 1C could not be obtained.

Figure 1C:
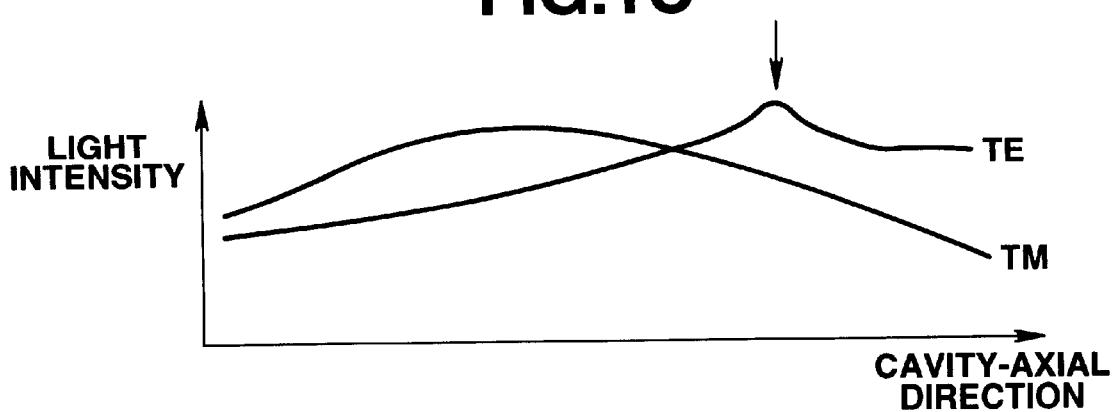
FIG. 1C is a view illustrating electric-field intensity distributions for the two polarization modes along the cavity-axial direction in the first embodiment.

In the above-discussed structure, as illustrated in FIG. 1C, an intensity peak of the TM mode lies in the first region 113 and that of the TE mode lies in the second region 114.

Figure 3:
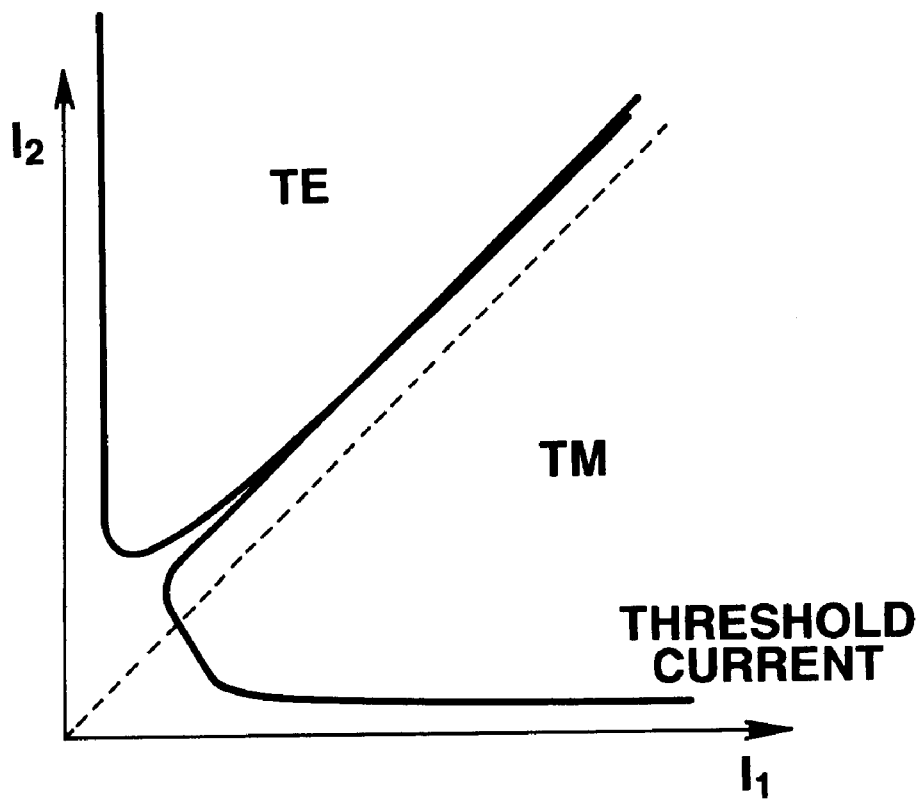
FIG. 3 is a graph illustrating a relation between a current injection condition and a lapsing polarization mode of the first embodiment.

The device is lased by injecting currents $I_1$ and $I_2$ into the first and second regions 113 and 114, respectively. FIG. 3 shows the relation between amounts of injected currents $I_1$ and $I_2$ and the oscillation polarization mode. Oscillation in the TM mode can be obtained under a uniform current injection condition shown by dotted line in FIG. 3. Namely, the tensile-strained active layer 104 of the triple quantum well structure, the location of the phase shift section S and so forth are constructed such that this oscillation manner can be attained. Under the uniform injection condition, as the current injected into the second region 114 (the TE mode has a relatively strong distribution of the field intensity in this region 114) is increased, the current 12 injected therein imparts more gain to the TE mode than to the TM mode. Therefore, there exists a current injection point where the lapsing mode changes from the TM mode to the TE mode. Even if the current injected into the second region 114 is further increased, oscillation in the TE mode remains unchanged because the intensity peak of the TE mode is present in the second region 114 but the intensity peak of the TM mode is not present therein. When the lapsing mode is to be returned from the TE mode to the TM mode, the current injected into the first region 113 (the TM mode has a relatively strong distribution of the field intensity in this region 113) only needs to be relatively increased by, for example, returning the current condition to the initial uniform current injection condition.

Regarding the relation between the bias condition of the two-electrode device and the lapsing polarization mode, the TM-mode oscillation is effected when the current injected into the first region 113 is larger, while the TE-mode oscillation is effected when the current injected into the second region 114 is larger, as discussed above. This phenomenon results from the structure in which the phase shift section for the TE mode is introduced into the second region 114.

[Second Embodiment]

Figure 2A:
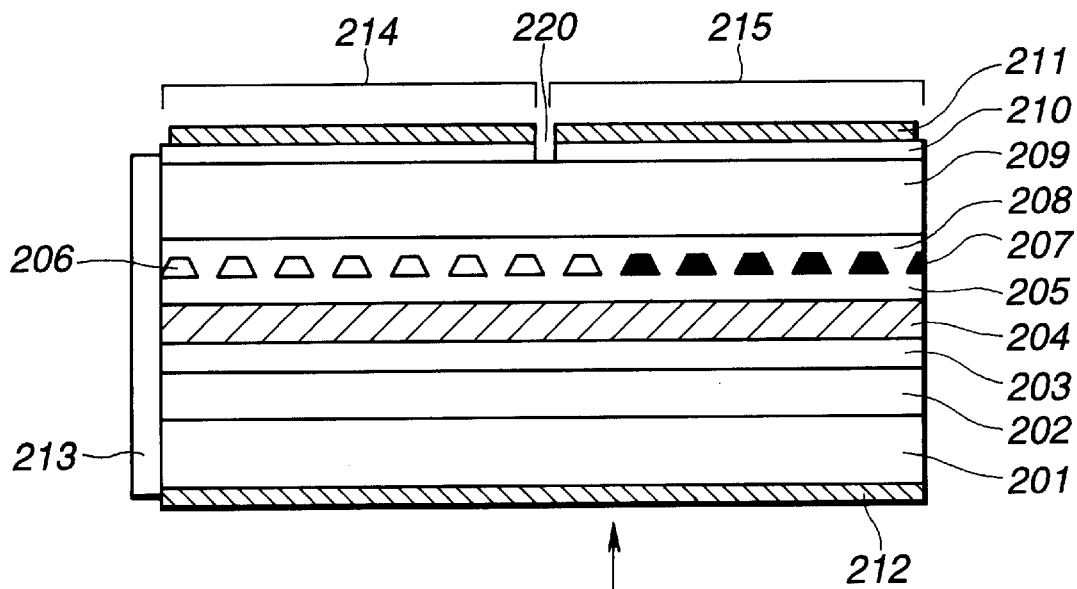
FIG. 2A is a cross-sectional view illustrating the cross section taken along a cavity-axial direction of a second embodiment of a DFB semiconductor laser according to the present invention.

A second embodiment of the present invention, directed to a distributed feedback (DFB) semiconductor laser, will be described with reference to FIGS. 2A–2C.

The device has the following structure. In FIG. 2A, reference numeral 201 designates an n-type InP substrate. Reference numeral 202 designates an n-type InP buffer layer. Reference numeral 203 designates a lower light guide layer of InGaAsP with a thickness of 0.1 μm and a bandgap wavelength of 1.17 μm. Reference numeral 204 designates a triple strained quantum well active layer having InGaAs well layers with a thickness of 13 nm, into which a 0.6% tensile strain is introduced, and InGaAsP barrier layers with a thickness of 10 nm and a bandgap wavelength of 1.17 μm. Reference numeral 205 designates an upper light guide layer of InGaAsP with a thickness of 0.1 μm and a bandgap wavelength of 1.17 μm. Further, reference numeral 206 designates a p-InGaAsP grating-forming layer with a thickness of 0.08 μm and a bandgap wavelength of 1.24 μm, which is formed on the upper light guide layer 205. Reference numeral 207 designates a multiple quantum well grating-forming layer with a thickness of 0.08 μm, which is also formed on the upper light guide layer 205.

Periodical striped grooves (which extend perpendicularly to a sheet of FIG. 2A and are arranged along right and left directions of FIG. 2A) at a pitch of 240 nm acting as a diffraction grating are formed on the layers 206 and 207, and thereafter those grooves are buried with a p-InGaAsP light guide layer 208 having a bandgap wavelength of 1.17 μm. Thus, those periodical stripes are arranged in the light guide layers 205 and 208 of a common material in the cavity direction at a common pitch.

Further, reference numeral 209 designates a p-type InP clad layer. Reference numeral 210 designates a p-type InGaAs contact layer. Reference numeral 211 designates a p-electrode of a Cr/Au layer. Reference numeral 212 designates an n-electrode of an AuGe/Au layer formed on the substrate side. Reference numeral 213 designates a high-reflection film of $SiO_2$ whose reflectance is slightly larger for the TE mode than for the TM mode. A separating portion 220 is formed by partly removing the p-electrode 211 and p-InGaAs layer 210, and the device is separated into the first and second regions 214 and 215 by the separating portion 220. Confinement of carriers and light in a lateral direction of the waveguide is achieved by a ridge-type waveguide, a buried-hetero-type waveguide, or the like.

In the compressively-strained multiple quantum well grating-forming layer 207 by which a portion (a portion in the second region 215) of the grating-forming layer 206 is replaced, ten pairs of $In_{0.69}Ga_{0.31}As_{0.66}P_{0.34}$ well layers with a 0.8% compressive strain and a thickness of 5 m and non-strained $In_{0.9}Ga_{0.1}As_{0.21}P_{0.79}$ barrier layers with a thickness of 5 m are deposited to construct a ten-well quantum well layer.

According to the thus-formed quantum well layer 207, its refractive index sensed by the TE-mode light at a wavelength of 1.55 μm is 3.343, while that sensed by the TM-mode light is 3.318. Thus, indices sensed by the two modes are far away from each other. On the other hand, the refractive index of the non-strained p-InGaAsP light guide layer 208 (Eg=1.17 μm) is 3.331, and the index of the p-InGaAsP grating-forming layer 206 (Eg=1.24 μm) is 3.374.

Although the layer structure of the second embodiment is similar to that of the first embodiment, the relation between the refractive indices of the p-InGaAsP grating-forming layer 206 and the p-InGaAsP light guide layer 208 burying the layer 206 is inverted compared with the first embodiment. As a result, the polarization mode which senses the phase shift at the phase shift section S is in turn the TM mode in the second embodiment.

The device of this embodiment is fabricated similarly to the first embodiment.

Figure 2B:
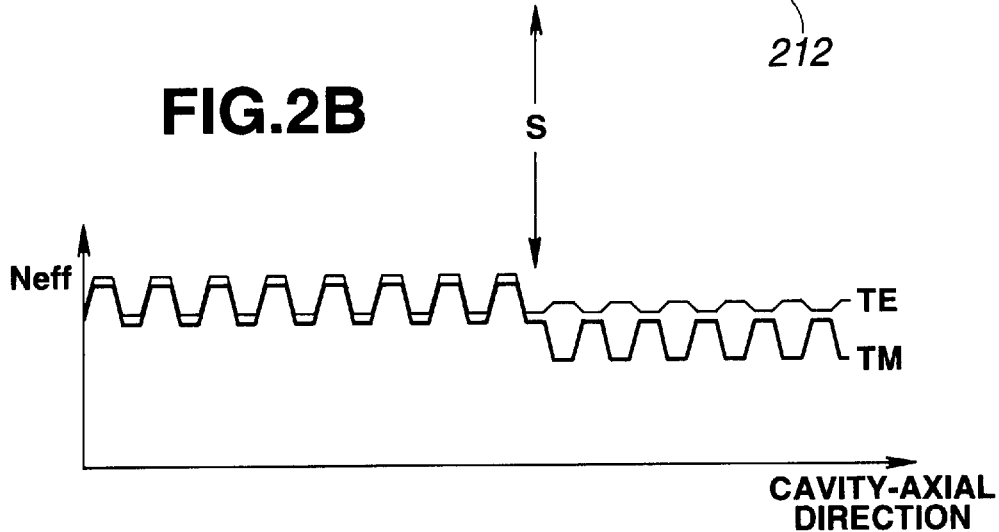
FIG. 2B is a view illustrating refractive-index distributions of diffraction gratings for two polarization modes along the cavity-axial direction in the second embodiment.

In FIG. 2B illustrating effective refractive-index distributions sensed by the TE-mode light and the TM-mode light along the cavity-axial direction, an up-and-down index change is inverted at the shift section S for the TM-mode light, while no inversion of the up-and-down index change appears at the shift section S for the TE-mode light though a change in its magnitude exists.

Figure 2C:
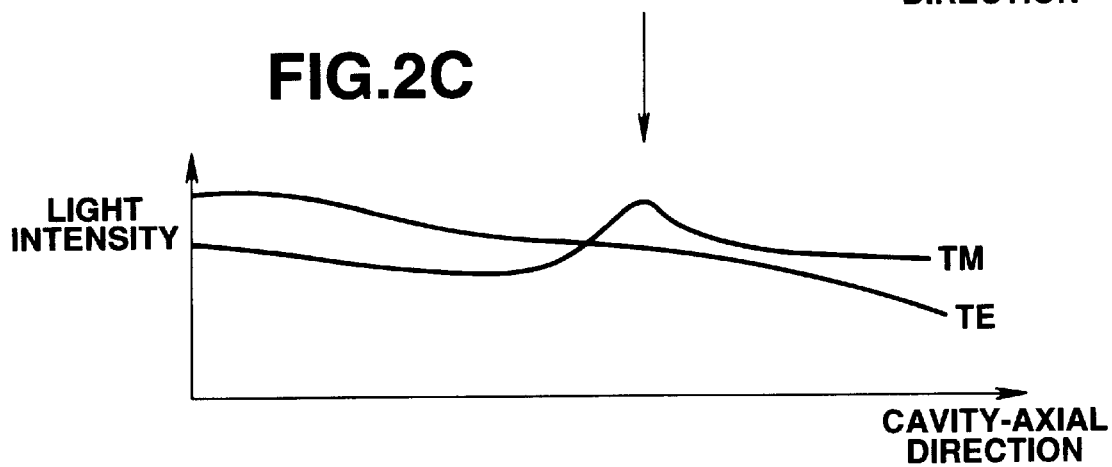
FIG. 2C is a view illustrating electric-field intensity distributions for the two polarization modes along the cavity-axial direction in the second embodiment.

In the above-discussed structure, as illustrated in FIG. 2C, strong portions of the light intensity distributions for the both modes tend to be attracted to the end facet on the side of the high-reflection film 213. For the TM mode, however, its light intensity is also strengthened around the phase shift section S. Consequently, the intensity peak of the light intensity distribution for the TE mode exists in the first region 214, while that for the TM mode exists in the second region 215.

The mode switching during the current injection time and the selection of the lapsing polarization mode in a nonuniform current injection state are substantially the same as those of the first embodiment, except the TE mode and the TM mode are exchanged compared with the first embodiment.

[Third Embodiment]

A third embodiment of the present invention, directed to an optical transmission system using a driving method of a light source for optical communication of the present invention, will be described with reference to FIG. 4.

Figure 4:
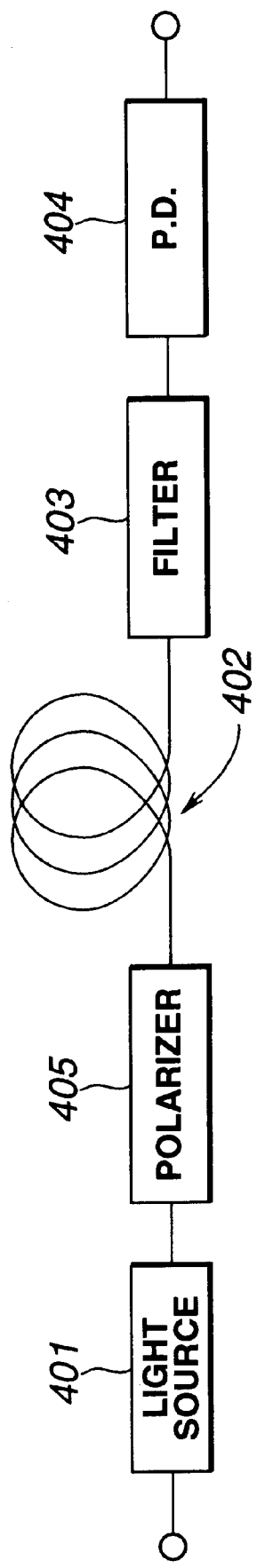
FIG. 4 is a block diagram illustrating an optical transmission system according to the present invention.

In FIG. 4, reference numeral 401 denotes a light source of the present invention, which can be modulated by changing its lapsing polarization mode. Mode-modulated signal light emitted from the light source 401 is transmitted through a polarizer 405 such that the mode-modulated signal light is converted to an intensity-modulated signal light. The intensity-modulated signal light is coupled to a monomode optical fiber 402. The intensity-modulated signal light sent through the optical fiber 402 is selectively demultiplexed by an optical filter 403 in a receiver. The thus-selected light of a desired wavelength is detected by a photodetector 404, and a digital signal is demodulated. Here a tunable fiber Fabry-Perot filter is used as the filter 403.

Although only one light source 401 and only one receiver are illustrated in FIG. 4, plural light sources and receivers connected by an optical coupler or the like can be used as well. A wavelength division multiplexing optical communication with a simple structure and advantageous performances can be achieved by using the light source of the present invention.

[Fourth Embodiment]

Figure 5:
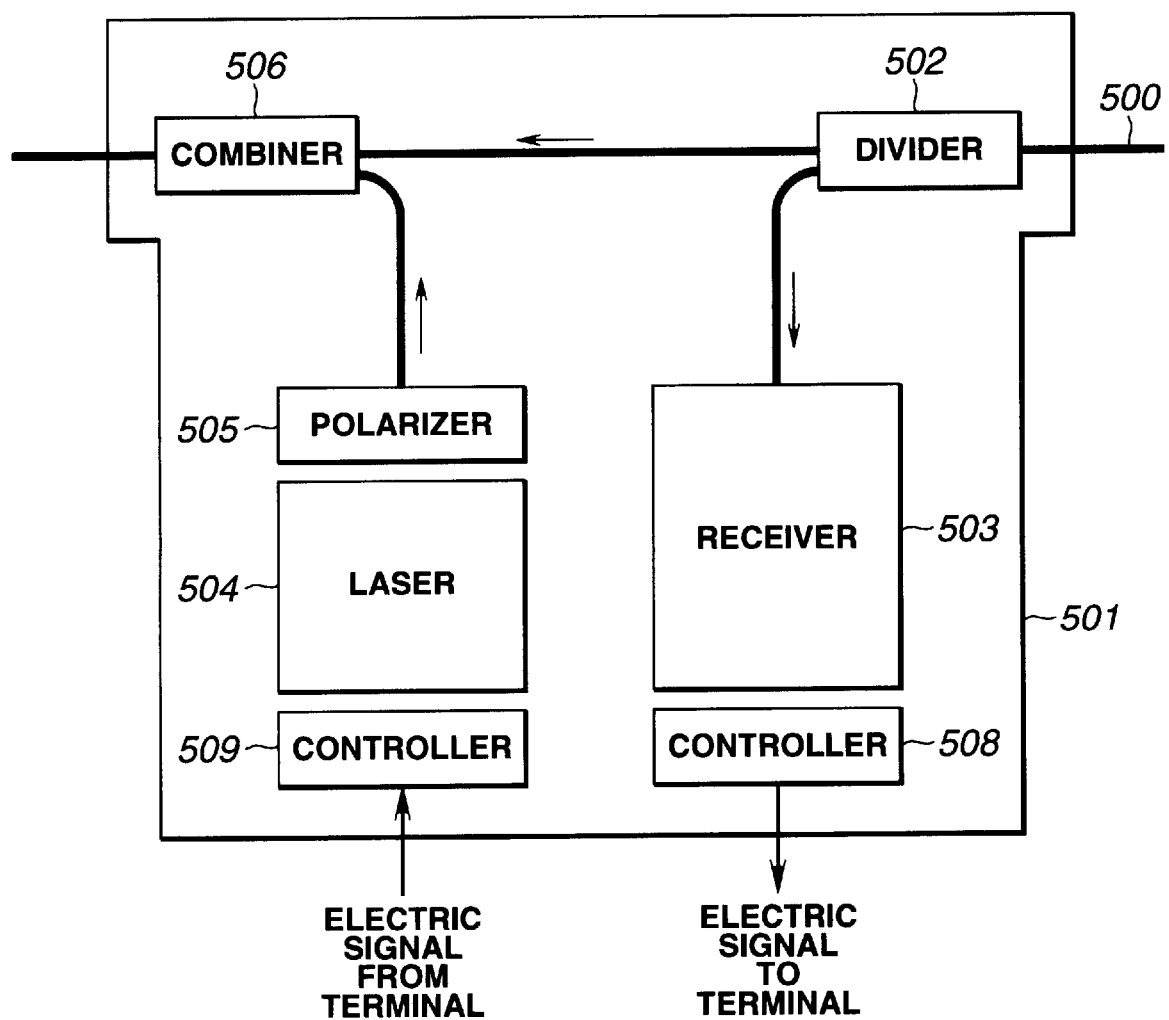
FIG. 5 is a block diagram illustrating an optical node according to the present invention.

A fourth embodiment will now be described with reference to FIGS. 5, 6 and 7. The fourth embodiment is directed to an optical local area network (LAN) system or a wavelength division multiplexing optical LAN system using a light source including an oscillation polarization switchable laser of the present invention. FIG. 5 illustrates an optoelectric converting unit (node) 501, which is connected to a terminal of the optical LAN system shown in FIG. 6 or FIG. 7.

In FIG. 5, an optical signal is taken into the node 501 through an optical fiber 500, and a portion of a signal is input into an optical receiver 503 by an optical power divider 502. The optical receiver 503 is controlled by a control circuit 508, and includes a tunable optical filter and a photodetector to select only signal light at a desired wavelength from the incident signal light and detect the selected signal.

On the other hand, when an optical signal is transmitted from the node 501, signal light from an oscillation polarization switchable semiconductor laser 504 of the present invention is input into the optical fiber 500 by a power combiner 506 through a polarizer 505 and an isolator (not shown). The laser 504 is appropriately driven by a control circuit 509 based on a signal according to the method described in the above embodiments, and a polarization-modulated light wave emitted from the laser 504 is converted to an intensity-modulated light output by the polarizer 505. The isolator may be omitted.

A plurality of tunable optical filters and semiconductor lasers may be arranged in a node to widen the wavelength tunable range.

Figure 6:
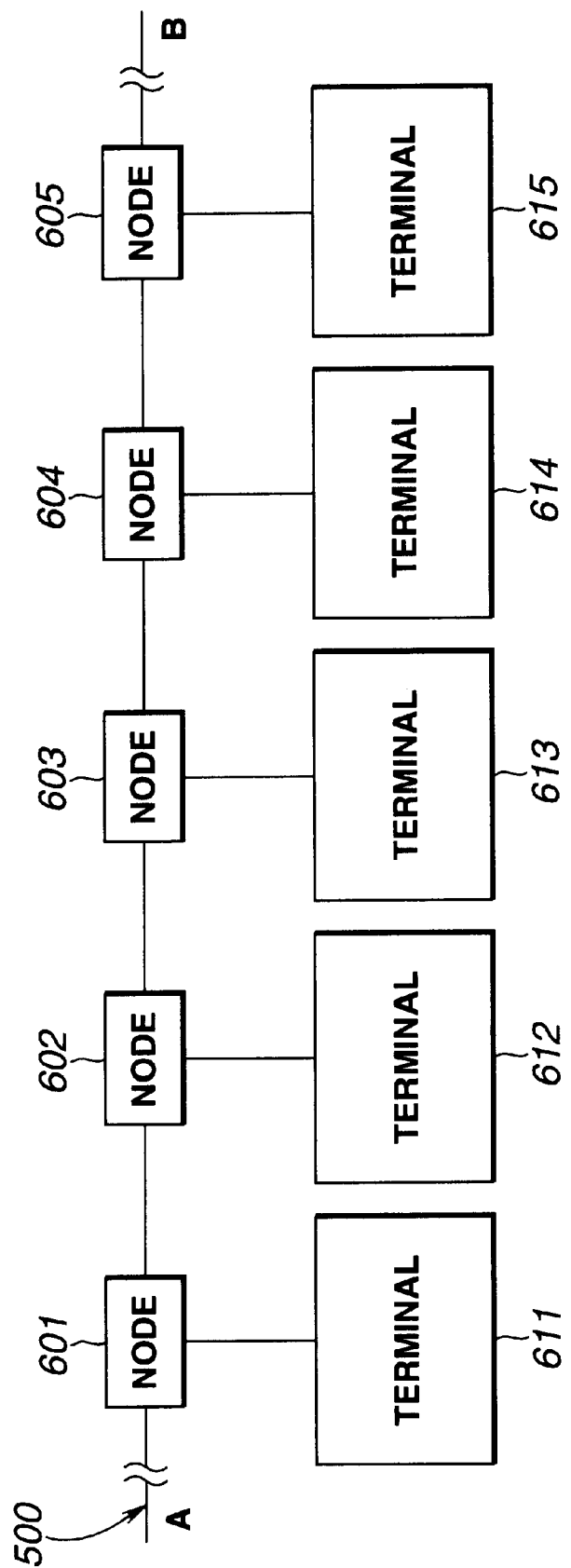
FIG. 6 is a block diagram illustrating a wavelength division multiplexing optical transmission system according to the present invention.

In a bus-type network shown in FIG. 6, multiple terminals or centers 611, 612, . . . , and 615 are connected to the optical fiber 500 respectively through optical nodes 601, 602, . . . , and 605 along a direction A–B. When a large number of nodes are connected, optical amplifiers need to be serially arranged on the transmission line 500 to compensate for attenuation of transmitted light.

Further, two nodes 601–605 may be connected to each terminal 611–615 and two optical fibers may be provided to accomplish bidirectional transmission of a distributed queue dual bus (DQDB) system.

As a network, a loop type (see FIG. 7), which is constructed by connecting A and B in FIG. 6, a star type, or compound configuration thereof may be used.

Figure 7:
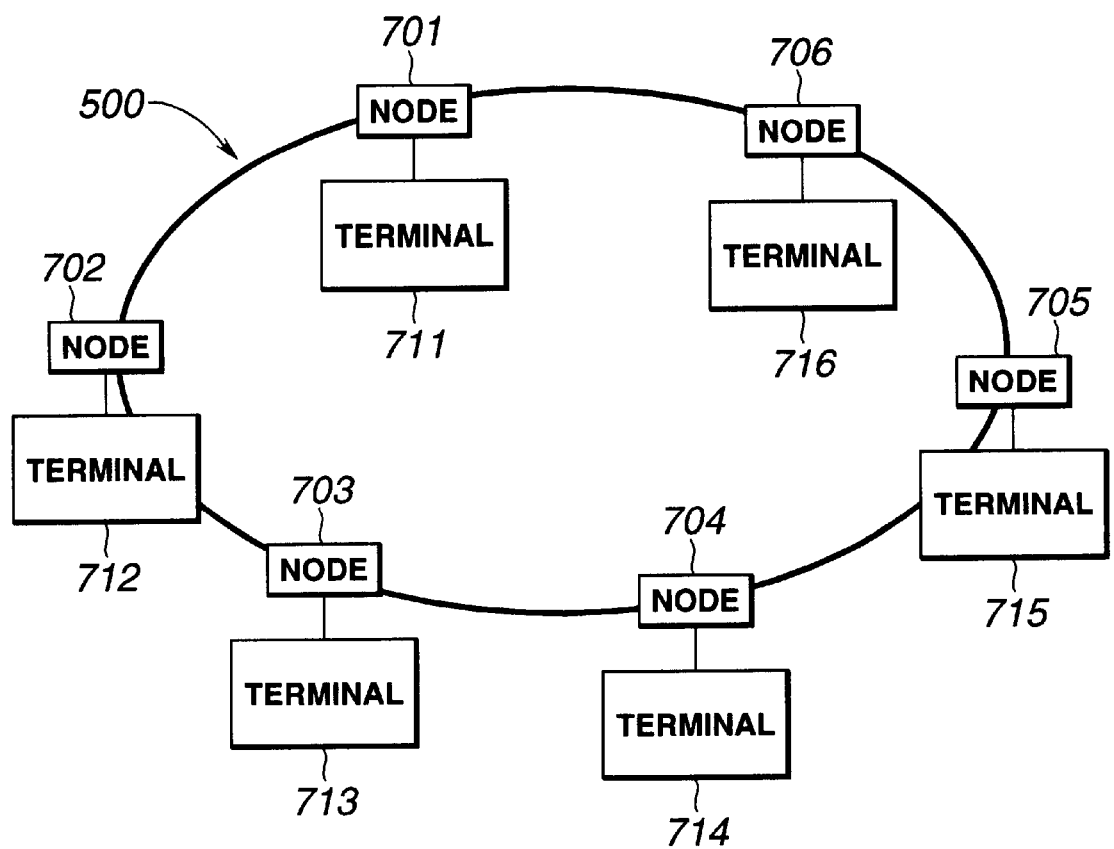
FIG. 7 is a block diagram illustrating another wavelength division multiplexing optical transmission system according to the present invention.

In the loop-type network shown in FIG. 7, reference numerals 701, 702, . . . , and 706 are nodes, and reference numerals 711, 712, . . . , and 716 are terminals, respectively.

Except as otherwise disclosed herein, the various components shown in outline or block form in any of the FIGS. 1–7 are individually well known in the optical semiconductor device, driving method therefor and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A distributed feedback semiconductor laser comprising:
   a cavity extending in a cavity-axial direction, said cavity including a plurality of regions;
   a waveguide with a diffraction grating and an active layer extending along the cavity-axial direction, said waveguide being formed in said regions, said diffraction grating having first and second regions including a plurality of periodical striped grooves, respectively, said grooves being buried in said first region with a member having a first refractive index, said grooves being buried in said second region with a member having a second refractive index, and different first and second polarization modes being defined by said first and said second regions of said diffraction grating;
   light intensity distribution control means comprising a phase shift section for shifting a phase of a periodical change in a refractive index for one of the first and second polarization modes due to said diffraction grating while not shifting a phase of a periodical change in a refractive index for the other of the first and second polarization modes due to said diffraction grating; and
   control means for independently stimulating at least two of said regions of said cavity.

2. A distributed feedback semiconductor laser according to claim 1, said light intensity distribution control means imparting a larger action, which relatively strengthens a light intensity distribution at a place of said light intensity distribution control means in said cavity, to one of the first and second polarization modes than to the other of the first and second polarization modes.

3. A distributed feedback semiconductor laser according to claim 2, said light intensity distribution control means imparting substantially no action to the other of the first and second polarization modes.

4. A distributed feedback semiconductor laser according to claim 1, said phase shift section shifting the phase of the periodical change in the refractive index for one of the first and second polarization modes by 180 degrees.

5. A distributed feedback semiconductor laser according to claim 1, said diffraction grating having said first region, in which periodical striped grooves formed in a birefringence layer with a birefringence of $n_{lTM}$ (a refractive index for TE-mode light) $>n_{lTM}$ (a refractive index for TM-mode light) are buried with a layer with a refractive index of $n_b$ satisfying $n_{lTE}>n_b>n_{lTM}$, and said second region, in which periodical striped grooves formed in a layer with a refractive index of $n_g$ satisfying $n_g<n_b$ are buried with a layer with a refractive index of $n_b$, being serially arranged in the cavity-axial direction to form said phase shift section for shifting the phase only for the TE-mode light at an interface between said two regions in said diffraction grating.

6. A distributed feedback semiconductor laser according to claim 5, wherein $(n_b-n_g)>(n_b-n_{lTM})$.

7. A distributed feedback semiconductor laser according to claim 5, a pitch of said diffraction grating being uniform in said two regions of said diffraction grating.

8. A distributed feedback semiconductor laser according to claim 5, said birefringence layer comprising a multiple quantum well layer.

9. A distributed feedback semiconductor laser according to claim 1, said diffraction grating having said first region, in which periodical striped grooves formed in a birefringence layer with a birefringence of $n_{lTE}$ (a refractive index for TE-mode light) $>n_{lTM}$ (a refractive index for TM-mode light) are buried with a layer with a refractive index of $n_b$ satisfying $n_{lTE}>n_b>n_{lTM}$, and said second region, in which periodical striped grooves formed in a layer with a refractive index of $n_g$ satisfying $n_g>n_b$ are buried with a layer with a refractive index of $n_b$, being serially arranged in the cavity-axial direction to form said phase shift section for shifting the phase only for the TM-mode light at an interface between said two regions in said diffraction grating.

10. A distributed feedback semiconductor laser according to claim 9, wherein $(n_g-n_b)>(n_{lTE}-n_b)$.

11. A distributed feedback semiconductor laser according to claim 9, a pitch of said diffraction grating being uniform in said two regions of said diffraction grating.

12. A distributed feedback semiconductor laser according to claim 9, said birefringence layer comprising a multiple quantum well layer.

13. A distributed feedback semiconductor laser according to claim 1, said phase shift section being located around a central portion of one of said regions of said cavity.

14. A distributed feedback semiconductor laser according to claim 1, said active layer comprising an active layer with approximately equal gains for the TE-mode light and the TM-mode light common to said regions of said cavity.

15. A distributed feedback semiconductor laser according to claim 1, further comprising a high-reflection film provided on an end facet of an outermost region of said regions of said cavity.

16. A distributed feedback semiconductor laser according to claim 15, said high-reflection film being provided on the end facet of said outermost region lacking said light intensity distribution control means.

17. A driving method for driving a distributed feedback semiconductor laser, said method comprising the steps:
   preparing a distributed feedback semiconductor laser which includes a cavity extending in a cavity-axial direction and including a plurality of regions, a waveguide with a diffraction grating and an active layer extending along the cavity-axial direction, formed in the regions, the diffraction grating having first and second regions including a plurality of periodical striped grooves, respectively, the grooves being buried in the first region with a member having a first refractive index, the grooves being buried in the second region with a member having a second refractive index and defining different first and second polarization modes, light intensity distribution control means comprising a phase shift section for shifting a phase of a periodical change in a refractive index for one of the first and second polarization modes due to the diffraction grating while not shifting a phase of a periodical change in a refractive index for the other of the first and second polarization modes due to the diffraction grating, and control means for independently stimulating at least two of the regions of the cavity;

injecting the currents into at least two of the regions by the control means to bring the semiconductor laser into an oscillation condition in the first polarization mode; and relatively increasing the current injected by the control means into the region, whose light intensity distribution for the second polarization mode is stronger than its light intensity distribution for the first polarization mode, to switch the oscillation condition in the first polarization mode to an oscillation condition in the second polarization mode.

18. A driving method according to claim 17, a uniform current being injected into at least two of the regions by the control means to bring the semiconductor laser into the oscillation condition in the first polarization mode.

19. A driving method according to claim 17, further comprising the step of relatively increasing the current injected by the control means into the region, whose light intensity distribution for the first polarization mode is stronger than its light intensity distribution for the second polarization mode, to switch the oscillation condition in the second polarization mode to the oscillation condition in the first polarization mode.

20. A light source apparatus comprising:
 a distributed feedback semiconductor laser which includes a cavity extending in a cavity-axial direction and including a plurality of regions, a waveguide with a diffraction grating and an active layer extending along the cavity-axial direction, formed in the regions, said diffraction grating having first and second regions including a plurality of periodical striped grooves, respectively, said grooves being buried in said first region with a member having a first refractive index, said grooves being buried in said second region with a member having a second refractive index and defining different first and second polarization modes, light intensity distribution control means comprising a phase shift section for shifting a phase of a periodical change in a refractive index for one of the first and second polarization modes due to said diffraction grating while not shifting a phase of a periodical change in a refractive index for the other of the first and second polarization modes due to said diffraction grating, and control means for independently stimulating at least two of the regions of said cavity; and
 polarization-mode selecting means for selecting light in one of the first and second polarization modes from light emitted from said distributed feedback semiconductor laser.

21. An optical communication system for communicating over a light transmission line that transmits a signal from a transmitter side to a receiver side, said system comprising:
 a light source apparatus, said light source apparatus including:
  a distributed feedback semiconductor laser which includes a cavity extending in a cavity-axial direction and including a plurality of regions, a waveguide with a diffraction grating and an active layer extending along the cavity-axial direction, formed in the regions, said diffraction grating having first and second regions including a plurality of periodical striped grooves, respectively, said grooves being buried in said first region with a member having a first refractive index, said grooves being buried in said second region with a member having a second refractive index and defining different first and second polarization modes, light intensity distribution control means comprising a phase shift section for shifting a phase of a periodical change in a refractive index of one of the first and second polarization modes due to said diffraction grating while not shifting a phase of a periodical change in a refractive index for the other of the first and second polarization modes due to said diffraction grating, and control means for independently stimulating at least two of the regions of said cavity; and
  polarization-mode selecting means for selecting light in one of the first and second polarization modes from light emitted from said semiconductor laser to create an intensity-modulated signal; and
 a receiver for detecting the intensity-modulated signal transmitted from said light source apparatus through the light transmission line.

22. An optical communication system according to claim 21, the light transmission line transmitting a plurality of intensity-modulated signals at a plurality of wavelengths generated by a plurality of said light source apparatuses, and said system further comprising an optical filter for selecting the intensity-modulated signal at a desired wavelength to be received on the receiver side.

23. An opto-electric converting apparatus for transmitting and receiving an intensity-modulated signal, said opto-electric converting apparatus comprising:
 a light source apparatus, said light source apparatus including:
  a distributed feedback semiconductor laser which includes a cavity extending in a cavity-axial direction and including a plurality of regions, a waveguide with a diffraction grating and an active layer extending along the cavity-axial direction, formed in the regions, said diffraction grating having first and second regions including a plurality of periodical striped grooves, respectively, said grooves being buried in said first region with a member having a first refractive index, said grooves being buried in said second region with a member having a second refractive index and defining different first and second polarization modes, light intensity distribution control means comprising a phase shift section for shifting a phase of a periodical change in a refractive index of one of the first and second polarization modes due to said diffraction grating while not shifting a phase of a periodical change in a refractive index for the other of the first and second polarization modes due to said diffraction grating, and control means for independently stimulating at least two of the regions of said cavity; and
  polarization-mode selecting means for selecting light in one of the first and second polarization modes from light emitted from said semiconductor laser to create an intensity-modulated signal; and a receiver for detecting an intensity-modulated signal transmitted through a light transmission line.

24. An optical communication system for communicating over a light transmission line that transmits a signal from a transmitter side to a receiver side, said system comprising:

an opto-electric converting apparatus for transmitting and receiving an intensity-modulated signal, said opto-electric converting apparatus comprising:

a light source apparatus, said light source apparatus including:

a distributed feedback semiconductor laser which includes a cavity extending in a cavity-axial direction and including a plurality of regions, a waveguide with a diffraction grating and an active layer extending along the cavity-axial direction, formed in the regions, said diffraction grating having first and second regions including a plurality of periodical striped grooves, respectively, said grooves being buried in said first region with a member having a first refractive index, said grooves being buried in said second region with a member having a second refractive index and defining different first and second polarization modes, light intensity distribution control means comprising a phase shift section for shifting a phase of a periodical change in a refractive index of one of the first and second polarization modes due to said diffraction grating while not shifting a phase of a periodical change in a refractive index for the other of the first and second polarization modes due to said diffraction grating, and control means for independently stimulating at least two of the regions of said cavity; and polarization-mode selecting means for selecting light in one of the first and second polarization modes from light emitted from said semiconductor laser to create an intensity-modulated signal; and a receiver for detecting an intensity-modulated signal transmitted through the light transmission line.

* * * * *

UNITED STATES PATENT AND TRADEMARK OFFICE
CERTIFICATE OF CORRECTION

PATENT NO.   : 6,337,868 B1
DATED        : January 8, 2002
INVENTOR(S)  : Natsukiko Mizutani It is certified that error appears in the above-identified patent and that said Letters Patent is hereby corrected as shown below:

<u>Column 9,</u>
Line 32, "5m" should read -- 5 nm --; and
Line 34, "5m" should read -- 5 nm --.

Signed and Sealed this

Twentieth Day of August, 2002

Attest:

JAMES E. ROGAN
*Attesting Officer*   *Director of the United States Patent and Trademark Office*